(12) United States Patent
Elliott

(10) Patent No.: US 6,745,908 B2
(45) Date of Patent: Jun. 8, 2004

(54) SHELF MODULE ADAPTED TO STORE SUBSTRATE CARRIERS

(75) Inventor: Martin R. Elliott, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/895,838

(22) Filed: Jun. 30, 2001

(65) Prior Publication Data

US 2003/0000898 A1 Jan. 2, 2003

(51) Int. Cl.[7] ................................................. A47F 5/08
(52) U.S. Cl. ..................... 211/90.04; 211/26.2; 211/187
(58) Field of Search ............................ 211/90.02, 187, 211/186, 41.18, 26, 26.2, 90.01, 90.03–90.04, 134, 153, 190, 87.01, 40; 312/265.1, 265.6, 223.2, 223.1; 361/683, 829, 724, 807, 810, 730; 403/408.1, 187, 188, 230, 256, 257; 414/416.08, 939–941, 935

(56) References Cited

U.S. PATENT DOCUMENTS

| | | | | |
|---|---|---|---|---|
| 3,471,029 A | * | 10/1969 | Dolan | 211/26 |
| 4,228,743 A | * | 10/1980 | Crook | 108/31 |
| 4,496,057 A | * | 1/1985 | Zenitani et al. | 211/26 |
| 4,497,411 A | * | 2/1985 | DeBortoli | 211/189 |
| 4,603,377 A | * | 7/1986 | Kobayashi et al. | 361/788 |
| 4,641,754 A | * | 2/1987 | Hebel et al. | 211/26 |
| 5,112,119 A | * | 5/1992 | Cooke et al. | 312/283 |
| 5,540,339 A | * | 7/1996 | Lerman | 16/381 |
| 5,697,811 A | * | 12/1997 | Pickles et al. | 211/175 |
| 5,730,574 A | | 3/1998 | Adachi et al. | |
| 5,749,671 A | * | 5/1998 | Chauquet | 174/88 B |
| 5,758,003 A | * | 5/1998 | Wheeler et al. | 385/134 |
| 5,807,012 A | * | 9/1998 | Emmert et al. | 248/126 |
| 5,859,947 A | * | 1/1999 | Kiryuscheva et al. | 356/153 |
| 5,941,654 A | * | 8/1999 | Chauquet | 174/88 B |
| 6,065,612 A | * | 5/2000 | Rinderer | 211/175 |
| 6,082,951 A | * | 7/2000 | Nering et al. | 414/217.1 |
| 6,102,214 A | * | 8/2000 | Mendoza | 211/26 |
| 6,135,698 A | | 10/2000 | Bonora et al. | |
| 6,138,721 A | | 10/2000 | Bonora et al. | |
| 6,170,784 B1 | * | 1/2001 | MacDonald et al. | 211/26 |
| 6,179,133 B1 | * | 1/2001 | Reece | 211/189 |
| 6,223,909 B1 | * | 5/2001 | Mendoza | 211/26 |
| 6,260,197 B1 | * | 7/2001 | Hoogewind | 2/8 |
| 6,283,692 B1 | * | 9/2001 | Perlov et al. | 414/217.1 |
| 6,307,756 B1 | * | 10/2001 | Liu et al. | 174/35 R |

FOREIGN PATENT DOCUMENTS

EP   1 047 115 A2   10/2000

* cited by examiner

Primary Examiner—Jennifer E. Novosad
(74) Attorney, Agent, or Firm—Dugan & Dugan LLP

(57) ABSTRACT

In a first aspect, a shelf module is adapted to store a plurality of substrate carriers. The shelf module includes (1) a plate; and (2) a plurality of shelves attached to the plate at respective elevations, each of the shelves being adapted to store a respective substrate carrier. Also provided are (1) an upper attachment mechanism adapted to attach an upper portion of the plate to a frame of a storage location; and (2) a lower attachment mechanism adapted to attach a lower portion of the plate to the frame of the storage location. At least one of the upper attachment mechanism and the lower attachment mechanism is adjustable so as to allow the plurality of shelves attached to the plate to be aligned to a reference as a unit.

45 Claims, 19 Drawing Sheets

US 6,745,908 B2

SHELF MODULE ADAPTED TO STORE SUBSTRATE CARRIERS

FIELD OF THE INVENTION

The present invention is concerned with semiconductor manufacturing, and is more particularly concerned with apparatus for storing carriers in which semiconductor substrates are stored.

BACKGROUND OF THE INVENTION

Semiconductor devices are made on substrates, such as silicon wafers or glass plates, for use in computers, monitors, and the like. These devices are made by a sequence of fabrication steps, such as thin film deposition, oxidation or nitration, etching, polishing, and thermal and lithographic processing. Although multiple steps may be performed in a single processing station, substrates must be transported between processing stations for at least some of the fabrication steps. Substrates are stored in open cassettes or sealed pods (hereinafter collectively referred to as "substrate carriers") for transfer between processing stations and other locations. Although substrate carriers may be carried manually between processing stations, the transfer of substrate carriers is typically automated. For example, a substrate carrier may be transported to a processing station in an automatic guided vehicle (AGV), and then loaded from the AGV onto a loading platform at the processing station by a robot. Another robot may extract a substrate from the substrate carrier and transport the substrate into a processing chamber at the processing station. When the fabrication steps are complete, the substrate is loaded back into the substrate carrier. Once all the substrates have been processed and returned to the substrate carrier, the substrate carrier is removed from the loading platform and transported to another location by the AGV.

Before or after extraction of substrates from the substrate carrier for processing, the substrate carrier may be stored on a storage shelf that is provided adjacent the processing station, or at a stocker unit that stores substrate carriers for a bay of processing stations. It is known to use a robot to place the substrate carrier on the storage shelf and to remove the substrate carrier from the storage shelf. Because automatic transport is employed, it is necessary that the storage shelf be very precisely aligned and positioned relative to the carrier transport robot and/or relative to other elements adjacent the processing station.

A loading and storage station installed adjacent to a processing station is disclosed in co-pending U.S. patent application Ser. No. 09/201,737 (AMAT No. 2862), entitled "Apparatus for Storing and Moving a Cassette". The '737 patent application is incorporated herein by reference in its entirety.

The loading and storage station of the '737 patent application includes a plurality of storage shelves so that a substrate carrier stocking capability is provided adjacent the processing station. The loading and storage station also includes a substrate carrier handling robot for moving substrate carriers between the shelves and a docking station. As noted before, the storage shelves must be precisely aligned and positioned relative to other elements of the loading and storage station. During conventional installation of the loading and storage station, a time-consuming and labor-intensive process is undertaken for proper installation and alignment of each of the storage shelves. It would be desirable to reduce the time and effort required for installation and alignment of substrate carrier storage shelves in connection with a loading and storage station or other substrate carrier stocking facility.

SUMMARY OF THE INVENTION

In accordance with a first aspect of the invention, a shelf module is provided that is adapted to store a plurality of substrate carriers. The shelf module includes (1) a plate; and (2) a plurality of shelves attached to the plate at respective elevations, each of the shelves being adapted to store a respective substrate carrier. Also provided are (1) an upper attachment mechanism adapted to attach an upper portion of the plate to a frame of a storage location; and (2) a lower attachment mechanism adapted to attach a lower portion of the plate to the frame of the storage location. At least one of the upper attachment mechanism and the lower attachment mechanism is adjustable so as to allow the plurality of shelves attached to the plate to be aligned to a reference as a unit.

In accordance with a second aspect of the invention, another shelf module is provided that is similar to the shelf module of the first aspect. However, in the shelf module of the second aspect, one of the upper and lower attachment mechanisms includes a gimbal joint and the other of the upper and lower attachment mechanisms is adapted to provided pitch and yaw adjustments to the plate. Numerous other aspects are provided, as are systems and methods.

Further features and advantages of the present invention will become more fully apparent from the following detailed description of exemplary embodiments of the invention, the appended claims and the accompanying drawings.

DETAILED DESCRIPTION

In accordance with the present invention a shelf module for a substrate carrier storage facility is formed with a plate as a main component or backbone to which plural shelves are secured. The plate or backbone is adjustably attached to a frame of the substrate carrier storage facility.

By appropriately aligning the plate, all of the shelves that are attached to the plate may be aligned with a reference such as a platform on which a wafer carrier is placed for wafer extraction and transport to a processing tool (i.e., a docking station). An exemplary docking station for opening sealed wafer carriers is disclosed in U.S. Pat. No. 6,082,951, the entire disclosure of which is incorporated herein by reference. As is familiar to those who are skilled in the art, a docking station may include a platform for receiving a wafer carrier and a mechanism for removing a door from the wafer carrier so that wafers can be transferred to and from the interior of the wafer carrier.

FIGS. 1A–1D are side views that illustrate in schematic terms respective embodiments of the invention. In each of FIGS. 1A–1D a shelf module 14 is mounted on a frame 12 of a substrate carrier storage location. The shelf module 14 includes a plate 24 to which storage shelves 26 are mounted. The shelf module 14 is mounted to the frame 12 via an upper attachment mechanism at 28 (shown in phantom in FIGS. 1C and 1D) and a lower attachment mechanism at 30 (shown in phantom in FIGS. 1A and 1B).

Figure 1A:
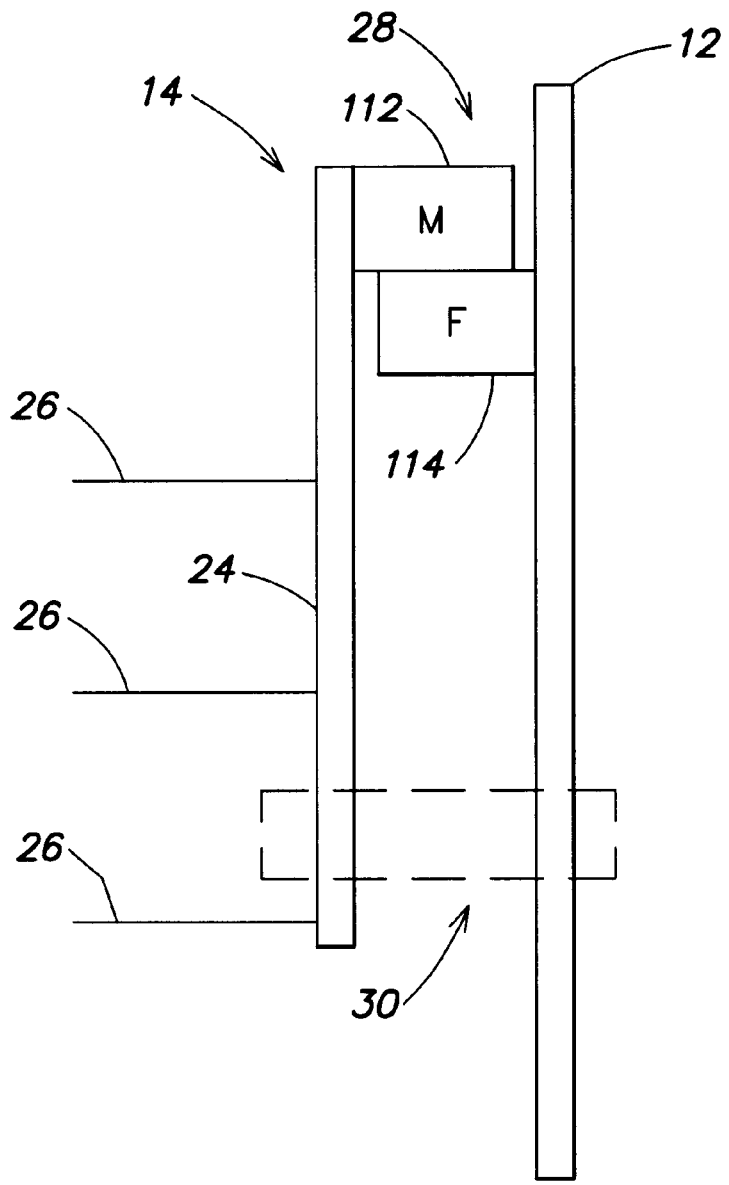
FIGS. 1A–1D are side schematic illustrations of a storage shelf module attached to a frame of a storage location according to respective embodiments of the invention.

In the embodiment of FIG. 1A the upper attachment mechanism 28 is constituted by a gimbal joint formed of a male portion 112 attached to an upper end of plate 24 and mating with a female portion 114 attached to an upper portion of the frame 12. The lower attachment portion 30 permits pitch and yaw adjustments of the shelf module 14 around the gimbal joint (as described further below) so that the shelf module 14 may be suitably aligned with a reference such as a docking station (shown in FIG. 1F) or other substrate carrier delivery location. The lower attachment portion 30 may comprise, for example, adjustment screws, bolts or other suitable adjustment mechanisms that provide pitch and yaw control. Proper alignment of the shelf module 14 results in suitable alignment of the shelves 26 attached thereto.

Figure 1B:
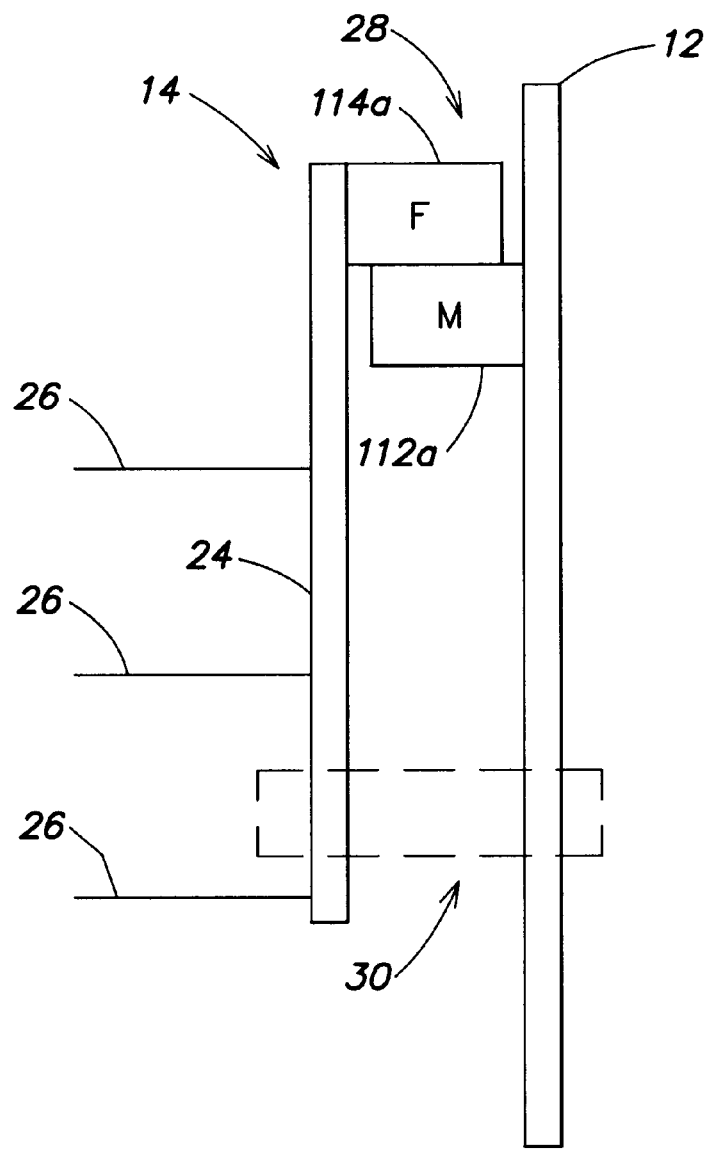

The embodiment of FIG. 1B is the same as the embodiment of FIG. 1A, except that the female portion 114a of the gimbal joint is attached to the plate 24 of the shelf module 14 and the male portion 112a of the gimbal joint is attached to the frame 12.

Figure 1C:
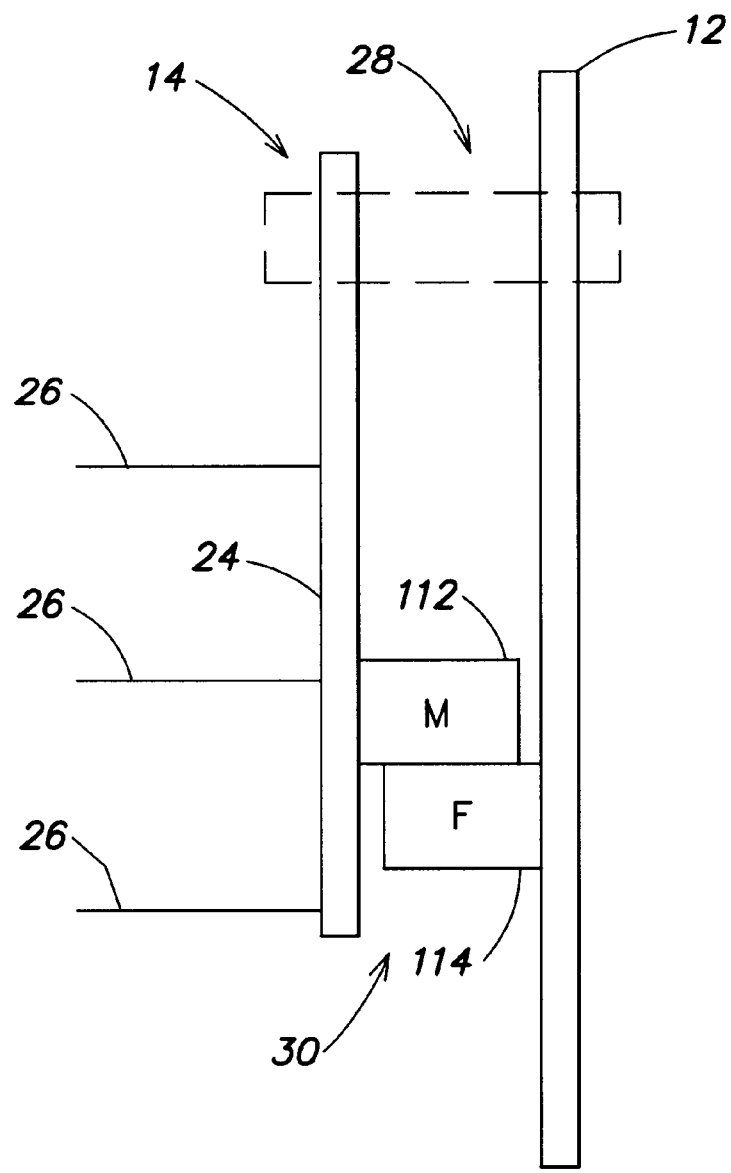
Figure 1D:
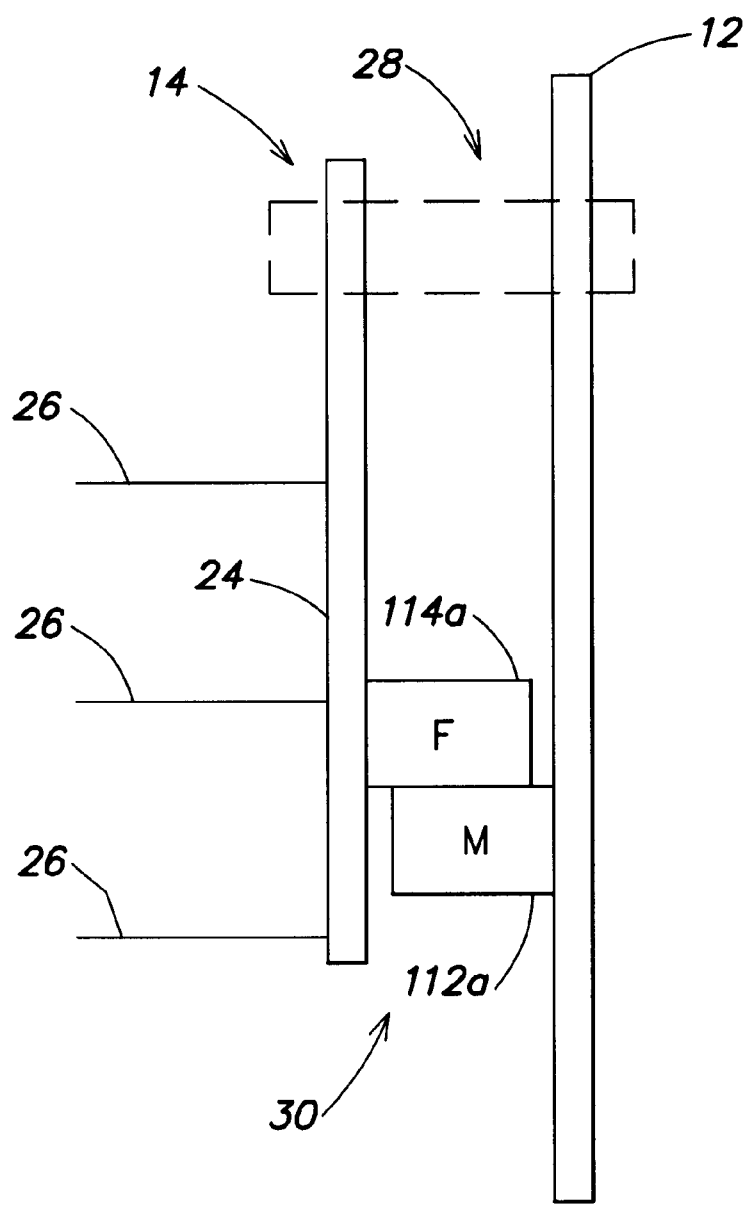

In the embodiments of FIGS. 1C and 1D, lower attachment mechanism 30 is constituted by a gimbal joint and upper attachment mechanism 28 allows for pitch and yaw adjustment around the gimbal joint to permit alignment of shelf module 14 with a reference (not shown) such as a docking station or other substrate carrier delivery location. In the embodiment of FIG. 1C, the male portion 112 of the gimbal joint is attached to the lower end of the plate 24 of the shelf module 14 and the female portion 114 of the gimbal joint is attached to a lower portion of the frame 12. In the embodiment of FIG. 1D, the female portion 114a of the gimbal joint is attached to the lower end of the plate 24 and the male portion 112a of the gimbal joint is attached to the lower portion of the frame 12.

It will be understood that in general, the attachment mechanism 28 (e.g., male portion 112 and/or female portion 114) and the attachment mechanism 30 may be integrally formed or machined into the frame 12 and/or the plate 24, or coupled thereto via any suitable coupling technique (e.g., screws, bolts, adhesives, etc.). That is, the embodiments provided herein are merely exemplary. As used herein, "attached" includes integrally formed therewith, machined therein or otherwise coupled thereto (e.g., via screws, bolts, adhesives, etc.).

Figure 1E:
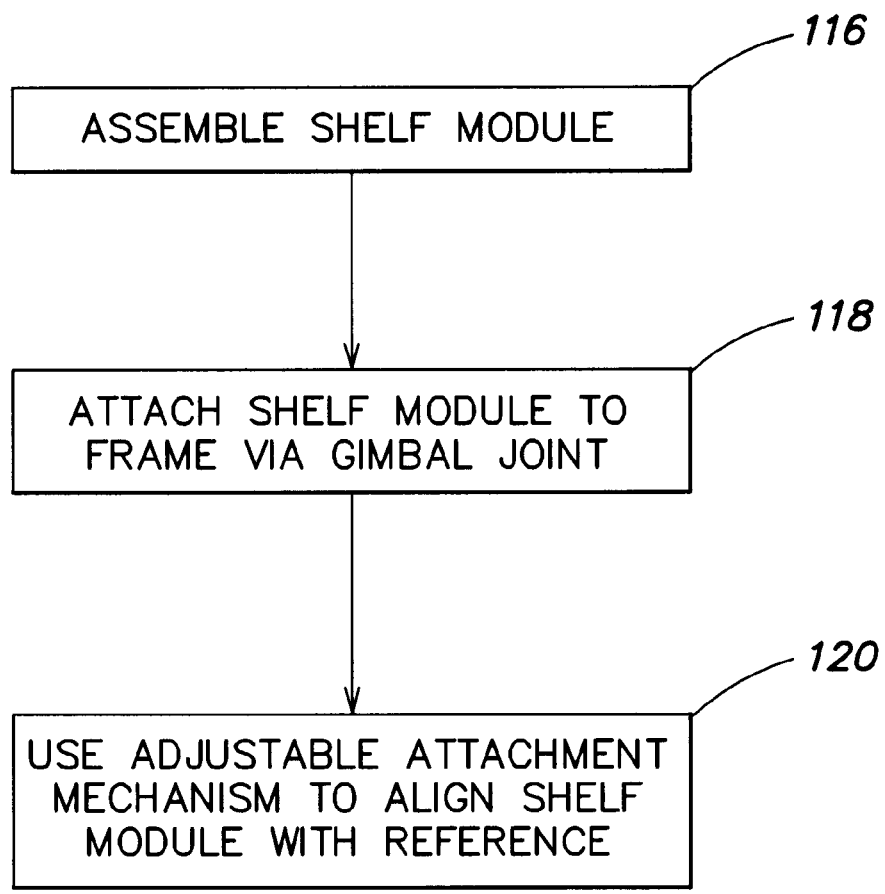
FIG. 1E is a flow chart that illustrates a method of installing and aligning a shelf module in accordance with the invention.

FIG. 1E is a flow chart that illustrates a method of installing and aligning a shelf module in accordance with the invention. At step 116 in FIG. 1E, the shelf module 14 is assembled by attaching the shelves 26 to the plate 24. As stated, the shelves 26 may be coupled to the plate 24, integrally formed therein, machined therein, etc. Then, at step 118, the shelf module 14 is mounted to the frame 12 via the gimbal joint (attachment mechanism 28 in the embodiments of FIGS. 1A, 1B; attachment mechanism 30 in the embodiments of FIGS. 1C, 1D). Next, at step 120, the adjustable attachment mechanism (lower attachment mechanism 30 in the embodiments of FIGS. 1A, 1B; upper attachment mechanism 28 in the embodiments of FIGS. 1C, 1D) is used to perform yaw and pitch adjustments as needed to align the shelf module 14 with a reference (e.g., a docking station or some other substrate carrier delivery location).

It should be understood that the order of the steps of FIG. 1E may be varied. For example, the shelves 26 may be attached to the frame 24 after the frame 24 is mounted to the frame 12, or after the plate 24 is mounted to the frame 12 and adjusted for alignment.

An exemplary embodiment of an inventive storage module which employs the inventive shelf module and corresponds to the embodiment of FIG. 1A will now be described in detail with reference to FIGS. 1F–11. The embodiments of FIGS. 1B–1D, and other embodiments, may be similarly or otherwise suitably configured.

In the embodiment of FIGS. 1F–11, the inventive shelf module is suspended at its upper end from a storage location frame via a gimbal joint. Pitch and yaw adjustments are made as needed around the gimbal joint to properly align the shelf module with a reference as described further below.

Figure 1F:
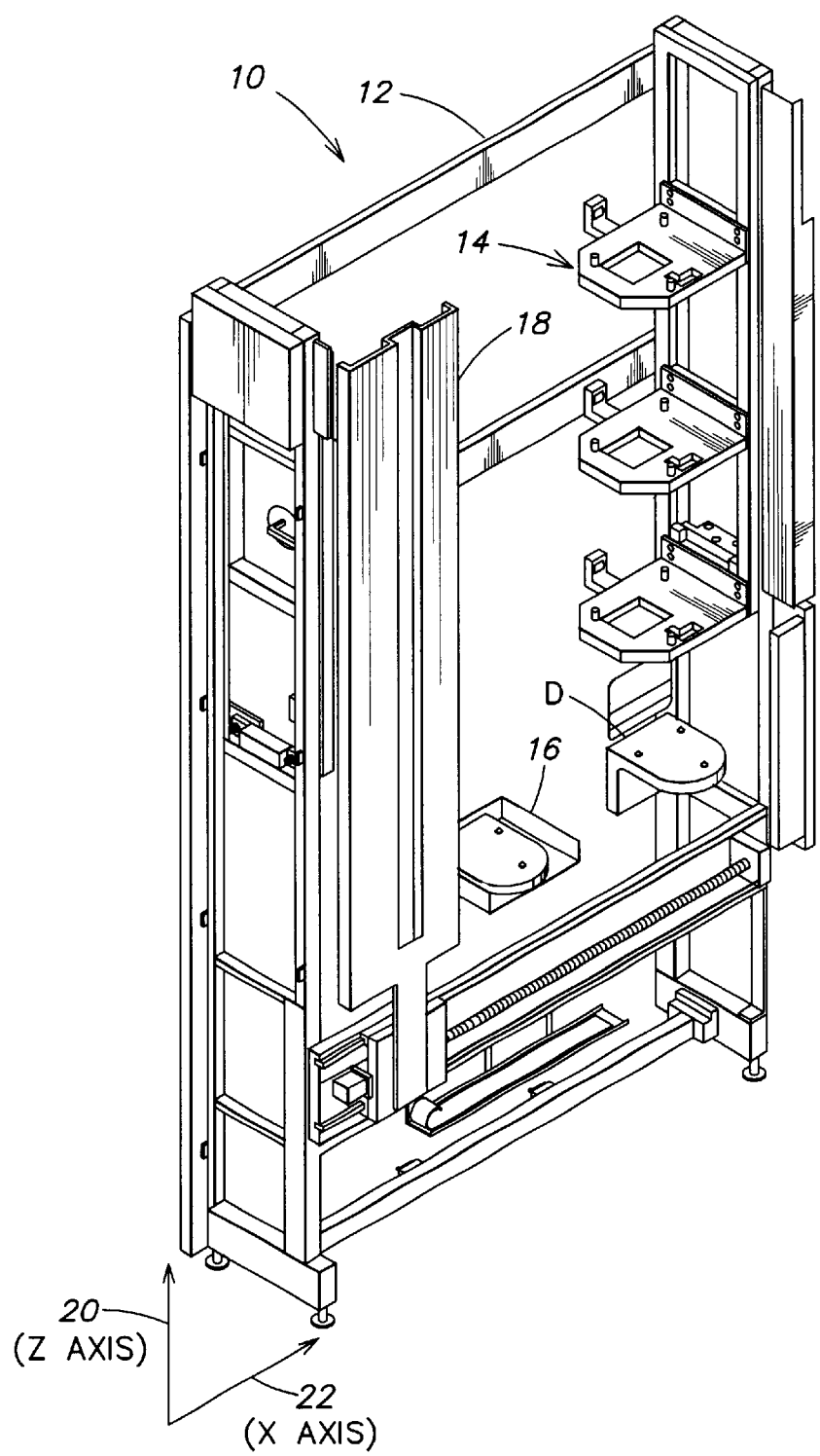
FIG. 1F is an isometric view of a substrate carrier storage and loading station in which the present invention may be applied.

FIG. 1F is an isometric view of a substrate carrier loading and storage station 10. In practice the loading and storage station 10 may be installed adjacent to an interface to a substrate processing station (not shown) such as a loadlock or factory interface of a processing tool. The interface to the substrate processing station may include one or more docking stations D (e.g., load ports) on which a substrate carrier is positioned to permit a substrate-handling robot (not shown) associated with a substrate processing station to unload substrates from the substrate carrier and to load the substrates into the substrate processing station. Storage stations so used are referred to herein as loading and storage stations.

As shown in FIG. 1F, loading and storage station 10 includes a frame 12 on which a storage shelf module 14 is mounted in accordance with the present invention. Also mounted on the frame 12 is a loading platform 16 where cassettes may be loaded into and removed from the storage and/or loading station. Frame 12 supports a robot 18 that transports substrate carriers among the docking stations D and the storage and loading positions of the loading and storage station 10 (described below). The robot 18 is arranged to transport substrate carriers in a vertical (Z axis) direction indicated by arrow 20 in FIG. 1F and in a horizontal (X axis) direction indicated by arrow 22 in FIG. 1F.

Figure 2:
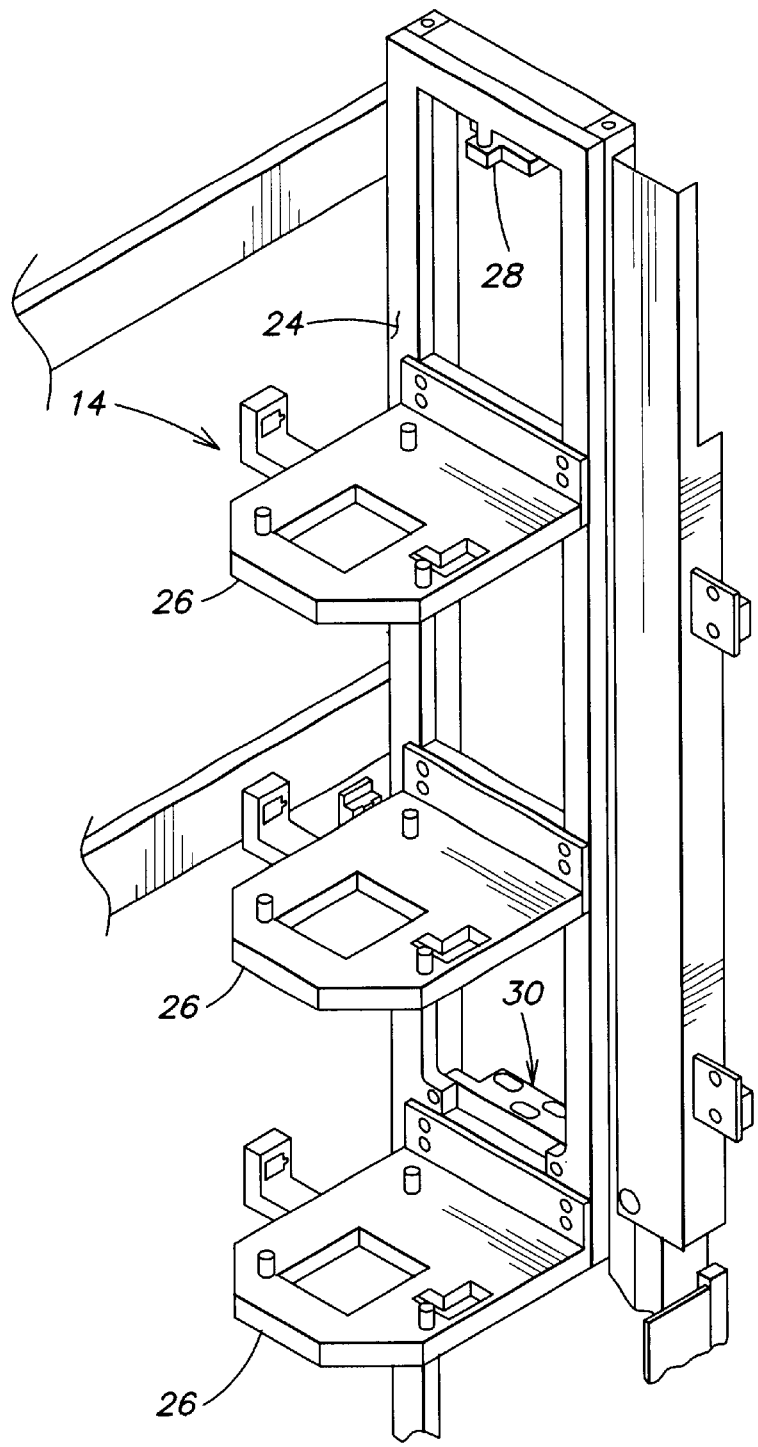
FIG. 2 is an isometric view of a shelf module provided in accordance with the invention and installed in the storage and loading station of FIG. 1.

FIG. 2 is an enlarged isometric view showing the shelf module 14 mounted on the frame 12. The shelf module 14 includes a main plate 24 to which individual storage shelves 26 are attached. The frame 12 may be made, for example, of welded tubular steel and the main plate 24 and the shelves 26 may be made of, for example, aluminum, although other materials may be used.

Figure 3:
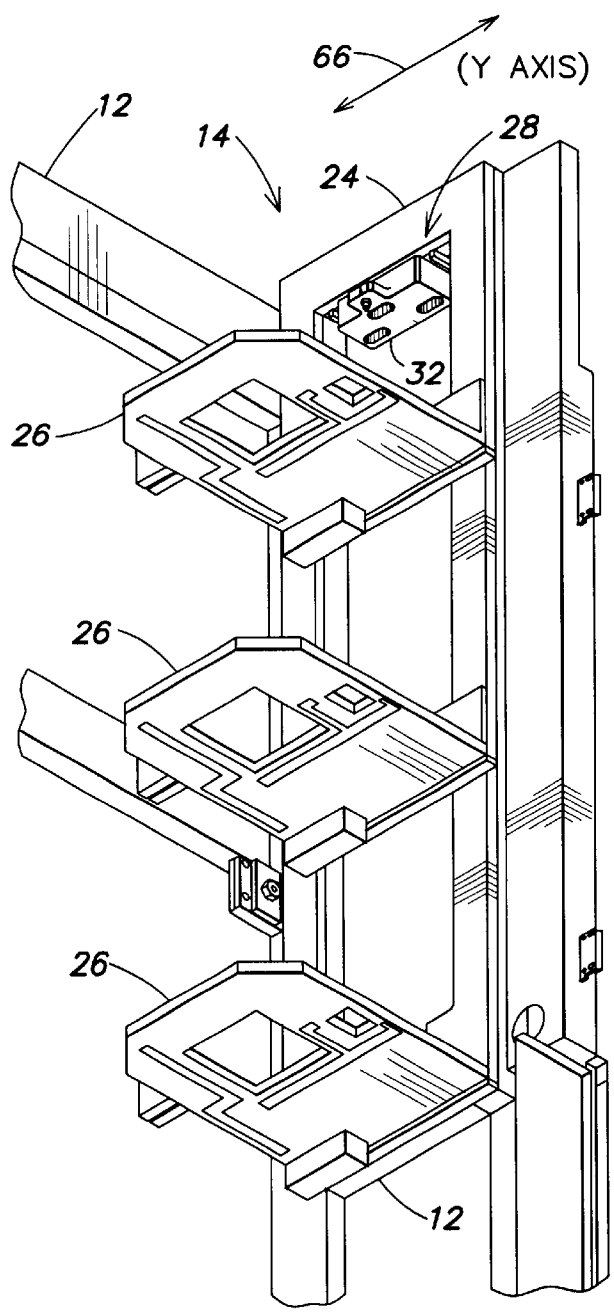
FIG. 3 is an isometric view taken from below the shelf module shown in FIG. 2.
Figure 4:
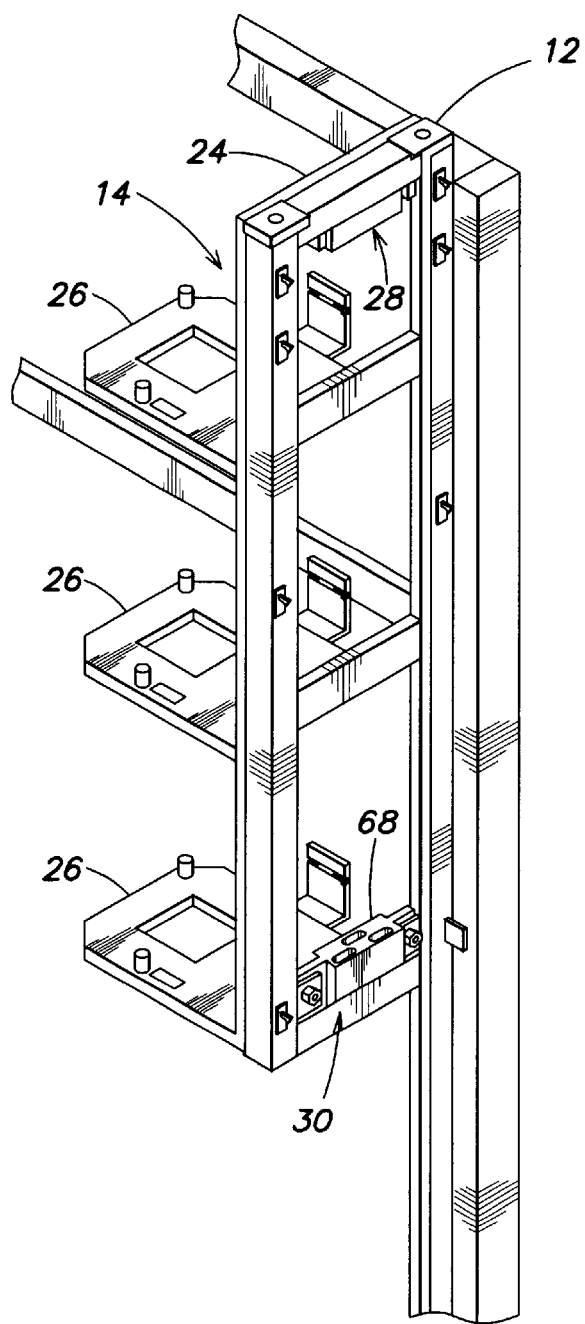
FIG. 4 is an isometric view taken from behind the shelf module installed on the frame of the storage and loading station.

FIG. 3 is a bottom isometric view of the shelf module 14 mounted on the frame 12, and FIG. 4 is a backside isometric view of the shelf module 14 mounted on the frame 12. The shelf module 14, and particularly the plate 24, is mounted to the frame 12 by means of an upper attachment mechanism 28 and a lower attachment mechanism 30, both described in detail with joint reference to FIGS. 5–7. In general, however upper attachment mechanism 28 includes a gimbal joint, and lower attachment mechanism 30 includes adjustment controls (e.g., adjustments screws) that allow pitch and yaw adjustments of the shelf module 24 around the gimbal joint. The implementation described below is merely one exemplary embodiment for achieving this functionality.

Figure 5:
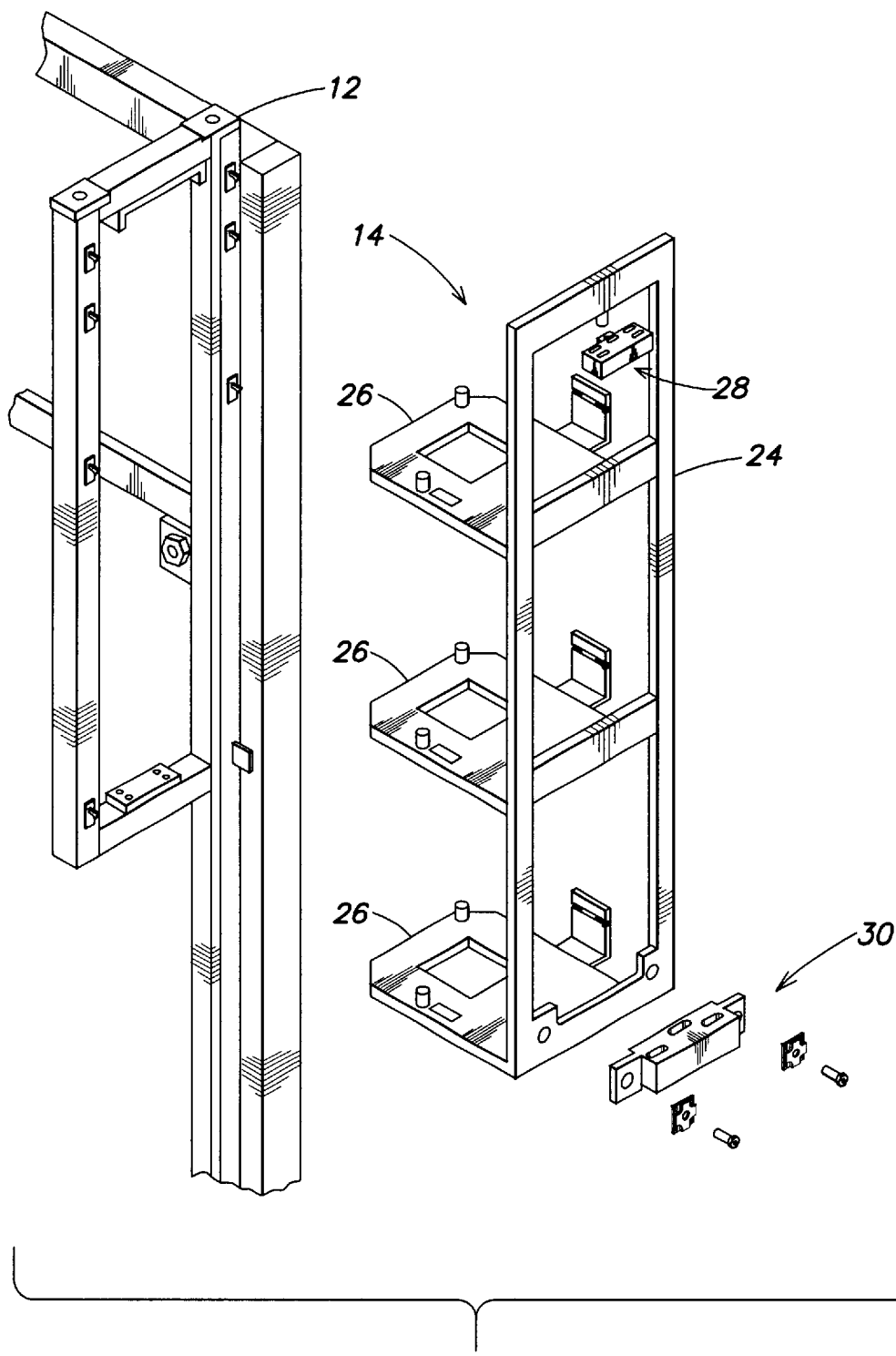
FIG. 5 is a partially exploded view of the shelf module and the frame of the storage and loading station.

FIG. 5 is a partially exploded view showing the shelf module 14 detached from the frame 12, and showing upper attachment mechanism 28 and lower attachment mechanism 30, in part, detached from the shelf module 14.

Figure 6:
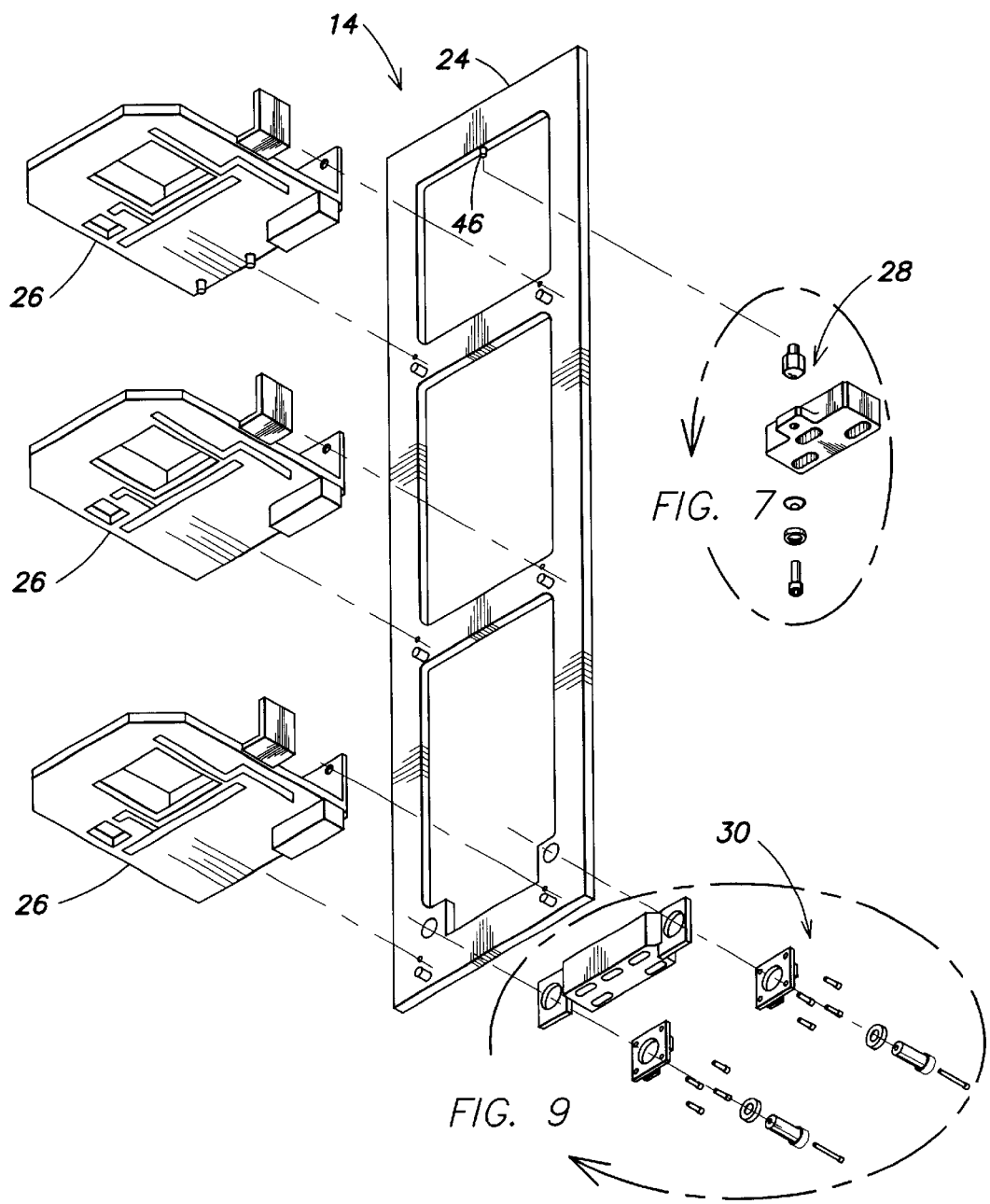
FIG. 6 is a more fully exploded view of the inventive shelf module.

FIG. 6 is a more completely exploded view, showing the shelves 26 detached from plate 24, and showing additional details of the upper attachment mechanism 28 (portion A of FIG. 6) and lower attachment mechanism 30 (portion B of FIG. 6).

Figure 7:
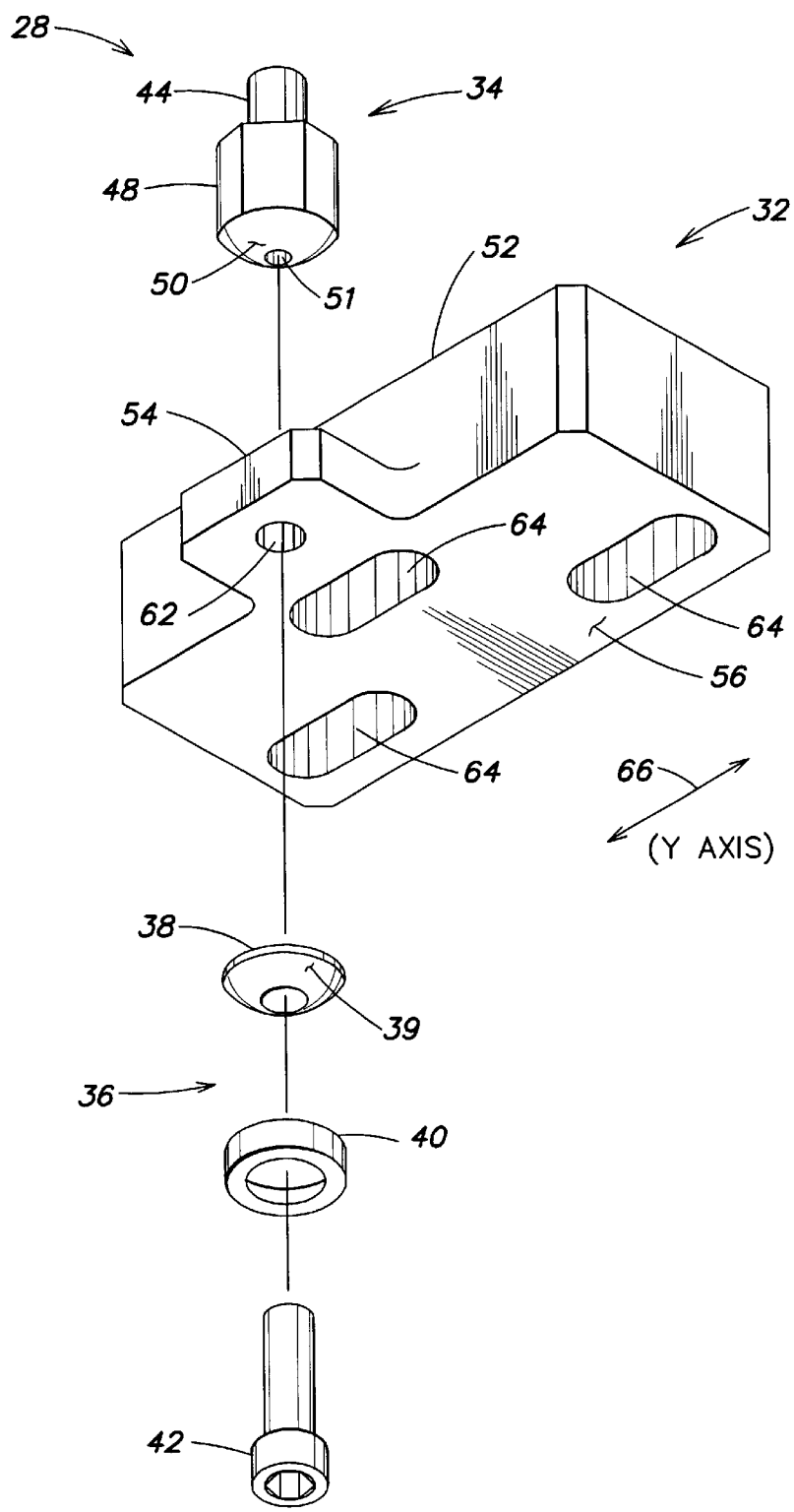
FIG. 7 is an exploded view of an upper attachment mechanism that is shown at portion of FIG. 6.
Figure 8:
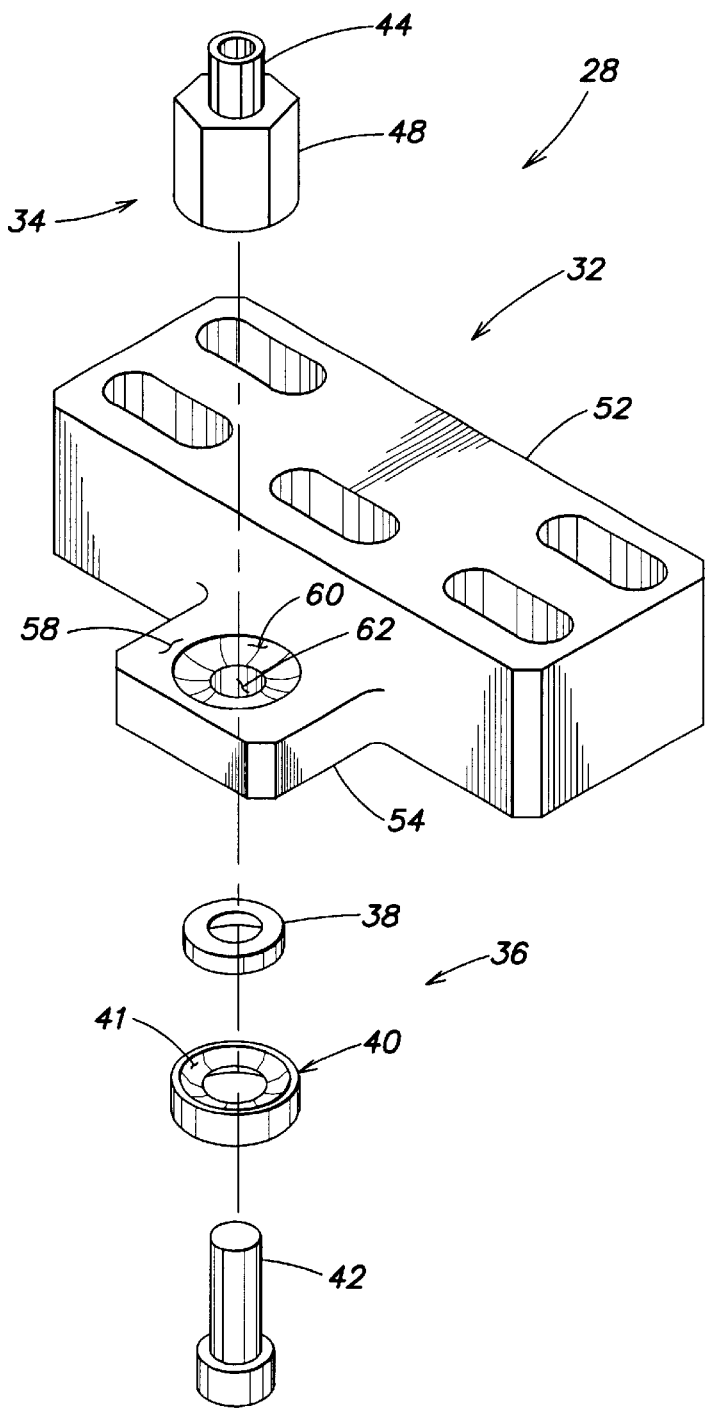
FIG. 8 is a further exploded view, taken from above, of the upper attachment mechanism of FIG. 7.

FIG. 7 is an enlarged exploded view of the shelf module 14's upper attachment mechanism 28, taken from below. FIG. 8 is an enlarged exploded view of the upper attachment mechanism 28, taken from above.

The shelf module's 14's upper attachment mechanism 28 includes an attachment block 32, a male spherical post 34, a spherical washer set 36 constituted by a male spherical washer 38 and a female spherical washer 40, and a cap screw 42. The male spherical washer 38 has a convex spherical surface 39 (FIG. 7) that seats in a concave spherical surface 41 (FIG. 8) of female spherical washer 40 to prevent binding of the spherical joint formed by upper attachment mechanism 28.

Figure 6A:
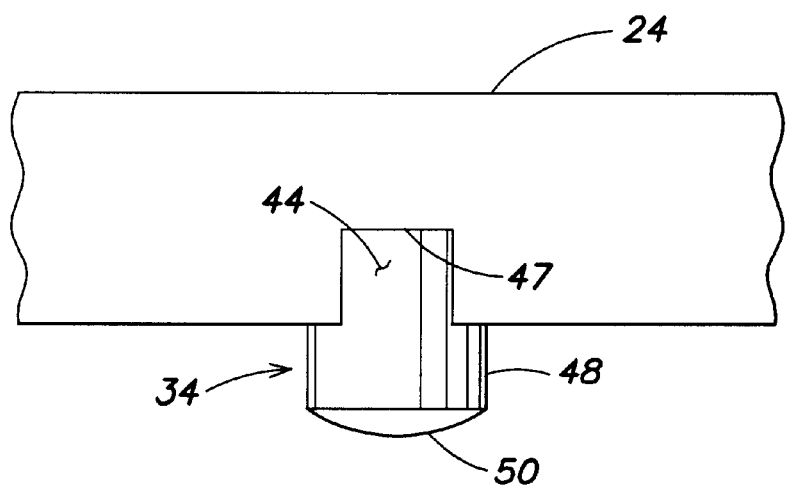
FIG. 6A is a cross-sectional view showing part of an upper attachment mechanism installed in the shelf module.

The male spherical post 34 has an upper section 44 that is threaded (threads not shown) so that the male spherical post 34 may be threaded into a threaded receptacle 47 (FIG. 6A) provided at location 46 (FIGS. 6 and 6A) on the plate 24. The male spherical post 34 also has a main body 48 having a lower spherical convex surface 50 (FIGS. 6A and 7). A threaded bore 51 is formed longitudinally through the male spherical post 34 to receive cap screw 42.

Attachment block 32 has a generally rectangular body 52 (although other shapes may be used) from which a horizontally-oriented flange 54 extends horizontally adjacent to a lower surface 56 (FIG. 7) of the rectangular body 52. It will be observed that the height of the flange 54 is less than the height of the rectangular body 52 to accommodate placement of male spherical post 34. In an upper surface 58 of the flange 54 a spherical depression 60 is formed (FIG. 8). An aperture 62 extends vertically through the flange 54 at the locus of the depression 60. Extending vertically through rectangular body 52 of attachment block 32 are elongated apertures 64.

The elongated apertures 64 are provided to permit the attachment block 32 to be secured to the frame 12 of loading and storage station 10 by means of fasteners which are not shown. The position at which the attachment block 32 is secured to the frame 12 is shown, for example, in FIG. 3. Because apertures 64 are elongated in the Y axis direction (arrows 66, FIGS. 3 and 7) the position of the attachment block 32 on the frame 12 is adjustable in the Y axis direction. Other directions of adjustment may be similarly provided (if desired).

The spherical depression 60 in the flange 54 forms a seat that is adapted to receive the lower spherical surface 50 of the male spherical post 34. Aperture 62 allows cap screw 42 to be threadedly inserted into the bore 51 of the male spherical post 34. Thus, the upper attachment mechanism 28 may be attached to the shelf module 14 when the male spherical post 34 of the upper attachment module 28 is threadedly mounted at location 46 (FIGS. 6 and 6A) of the shelf module's plate 24. Attachment block 32 is secured to the frame 12 (as indicated in FIG. 3) via fasteners such as bolts or screws (not shown) that extend through the elongated apertures 64 and the lower spherical surface 50 of male spherical post 34 nests in the spherical depression 60 of flange 54. Frame 12 thus suspendedly supports storage shelf module 14 via flange 54 of attachment block 32. Nevertheless, by virtue of the spherical joint formed at the interface between the spherical surface 50 of the male spherical post 34 and the spherical depression 60 of the attachment block 32, the storage shelf module 14 remains free for adjustment about the Y axis (pitch adjustment) and about the Z axis (yaw adjustment).

Figure 9:
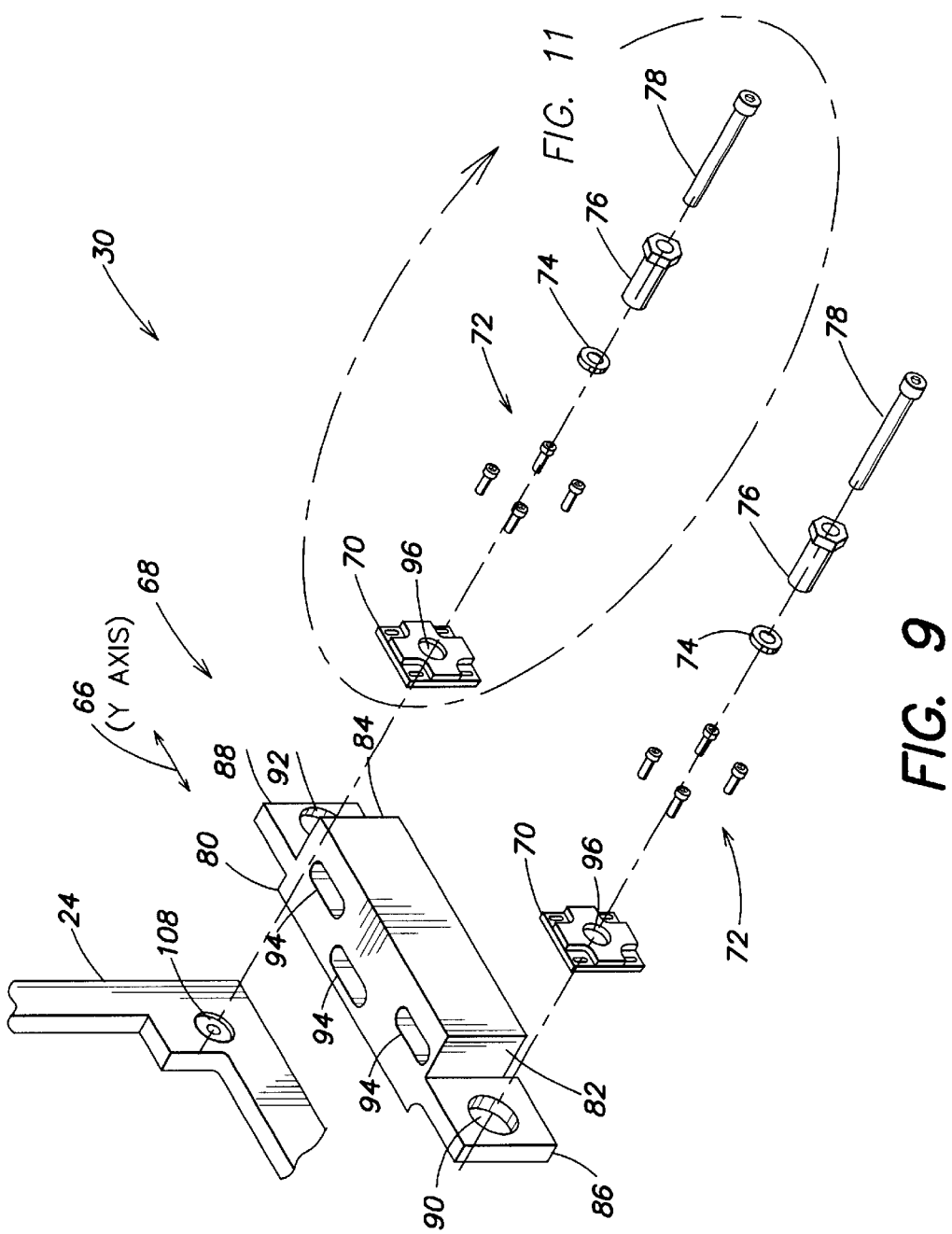
FIG. 9 is an exploded view showing a lower attachment mechanism seen in portion of FIG. 6.
Figure 10:
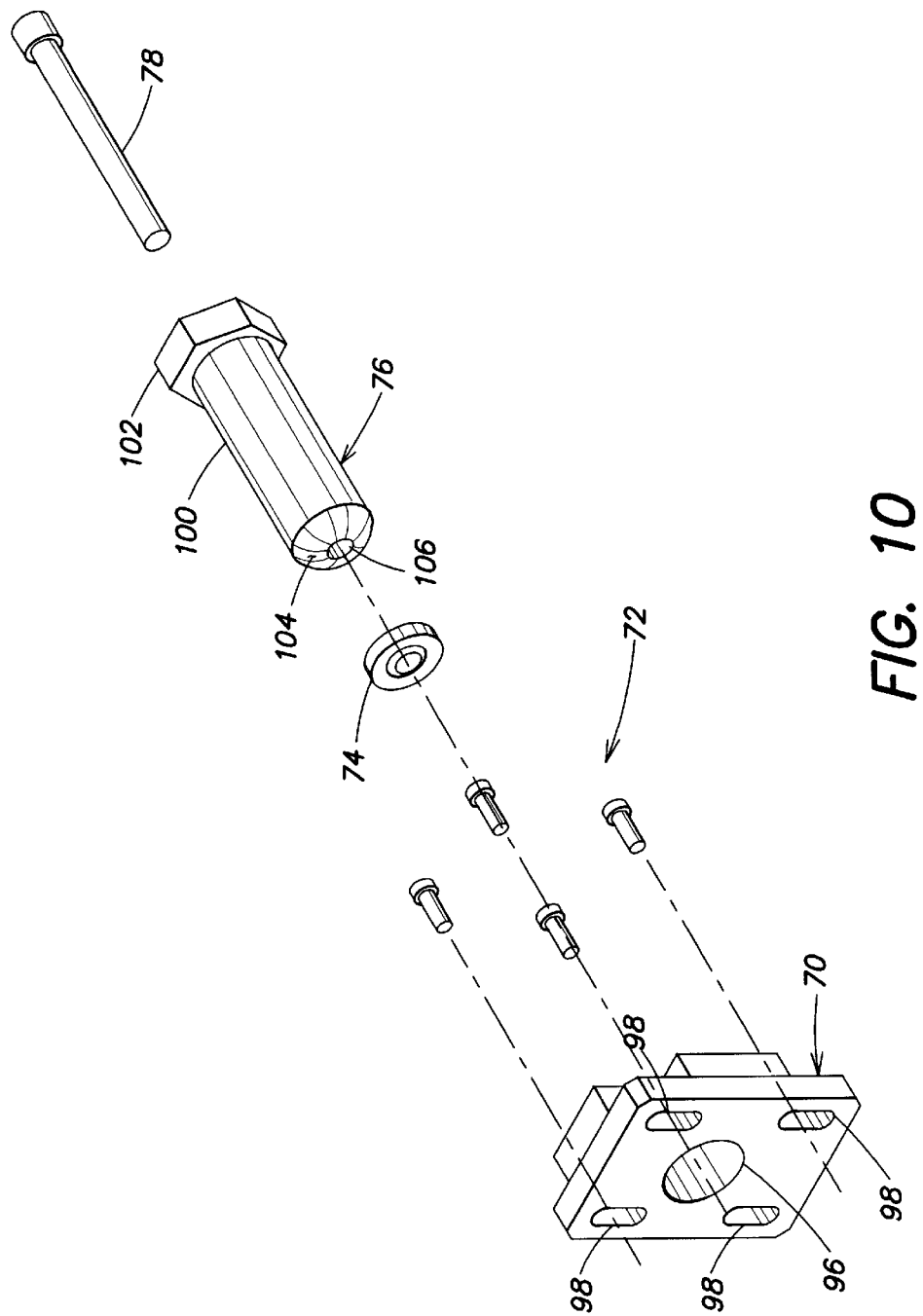
FIG. 10 is a further exploded view, taken from the front, of the components of the lower attachment mechanism shown in portion of FIG. 9.
Figure 11:
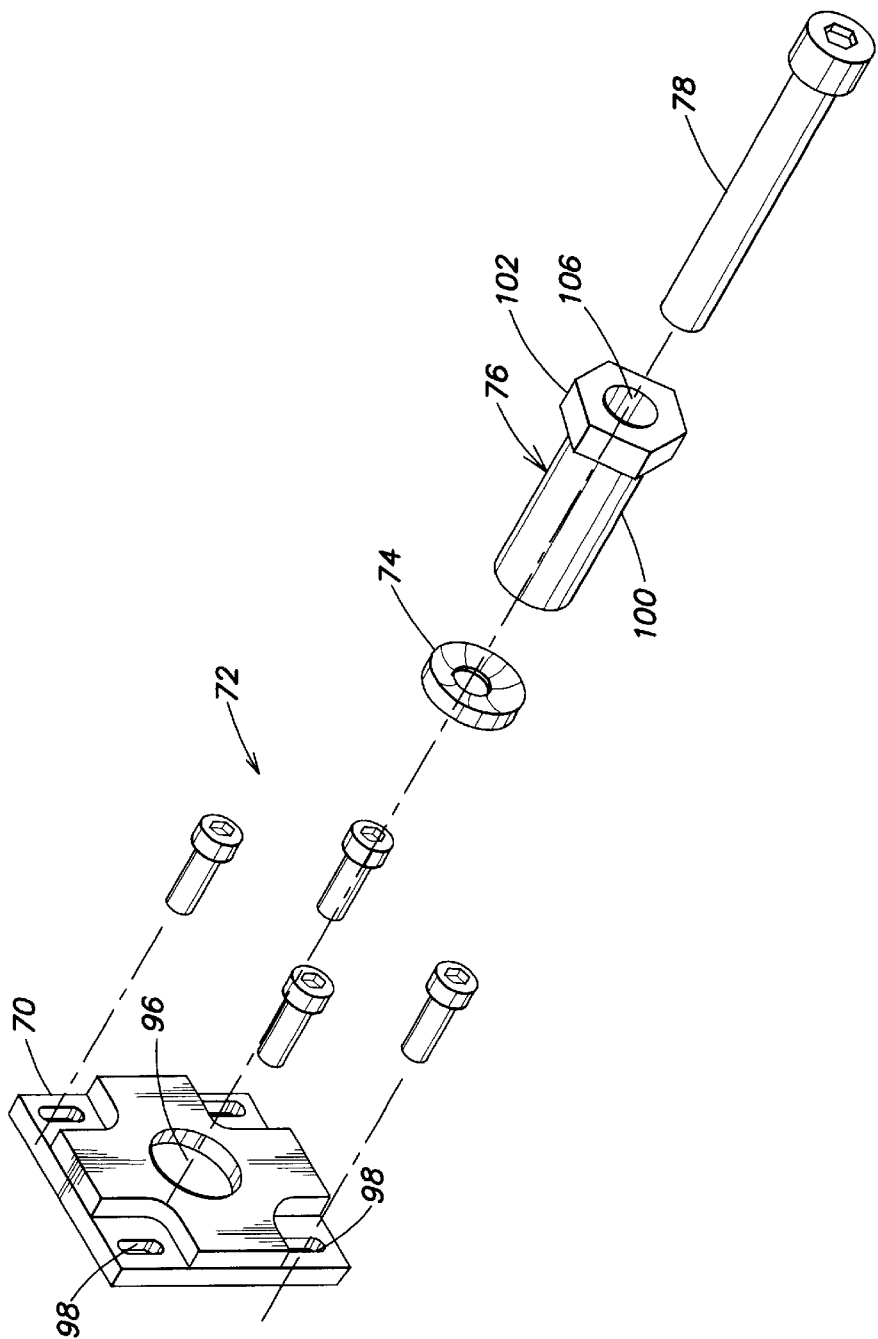
FIG. 11 is an enlarged exploded view, taken from the rear, of the components of the lower attachment mechanism shown in FIG. 10.
Figure 11A:
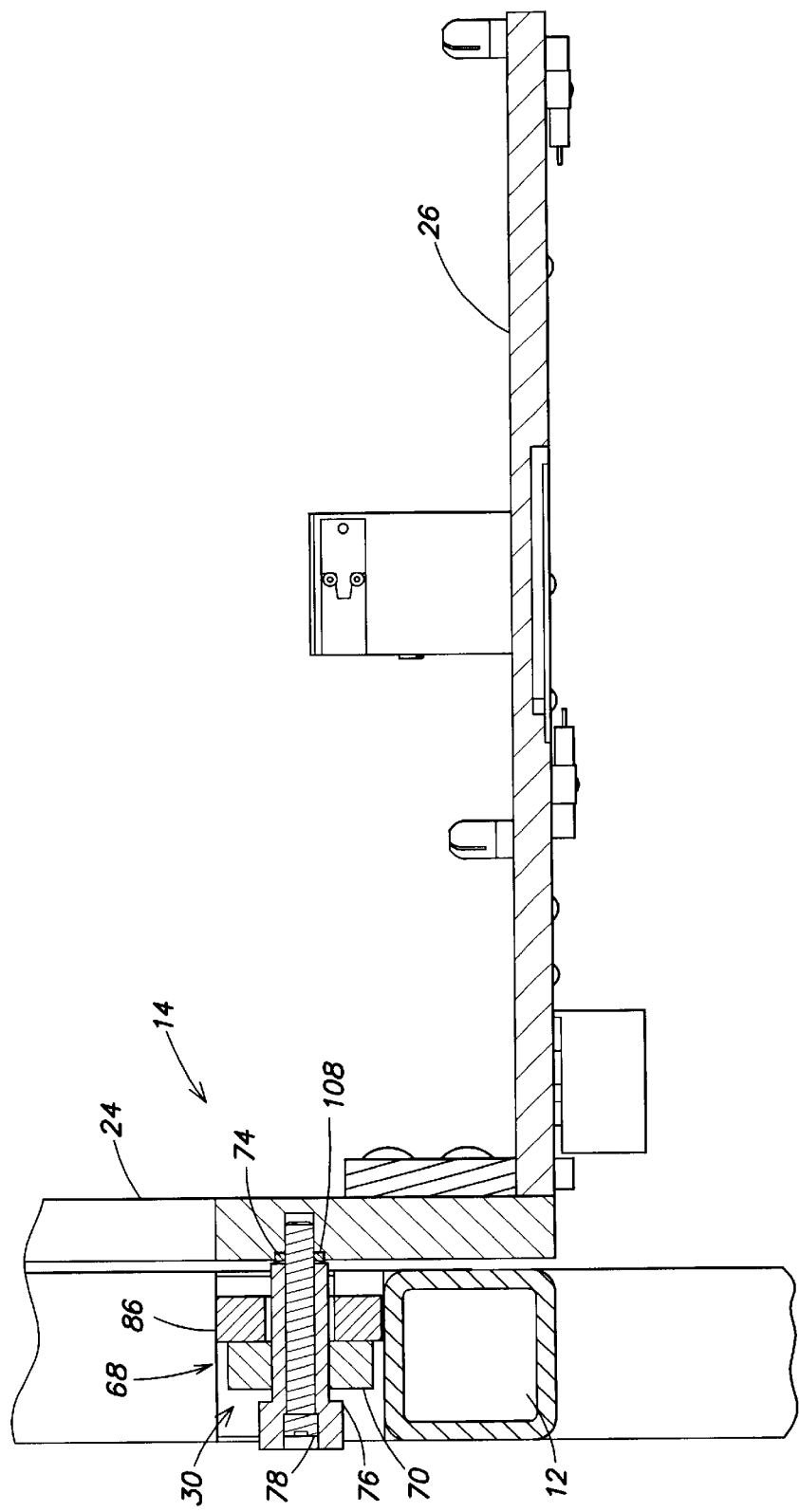
FIG. 11A is a cross-sectional view showing the shelf module attached to the frame of the storage location by the lower attachment mechanism.

Lower attachment mechanism 30 will now be described with reference to FIGS. 9–11A. FIGS. 9–11 are all exploded views of the lower attachment mechanism 30, with FIG. 9 taken from behind, and FIGS. 10 and 11 showing a portion of FIG. 9 on a larger scale, FIG. 10 being taken from the front, and FIG. 11 being taken from the rear. FIG. 11A is a cross-sectional view showing the shelf module 14 secured to the frame 12 by means of the lower attachment mechanism 30.

As seen from FIG. 9, the lower attachment mechanism 30 includes an adjustment housing 68, a pair of subplates 70, fasteners 72, a pair of female spherical washers 74, a pair of male spherical posts 76 and cap screws 78.

Adjustment housing 68 has a generally rectangular body 80 (although other shapes may be employed). At opposite ends 82, 84 of the body 80, vertically oriented flanges 86, 88 respectively extend horizontally outwardly. Apertures 90, 92 are respectively formed in flanges 86, 88. Elongated apertures 94 pass vertically through body 80 of adjustment housing 68.

As best seen in FIG. 10, each subplate 70 has a large circular aperture 96 at a central portion of the subplate and four vertically elongated smaller apertures 98 each located at a respective corner of the subplate 70.

Each male spherical post 76 has a threaded cylindrical body 100 (threads not shown), a hexagonal head 102 at one end of the spherical body 100, and a convex spherical surface 104 (FIG. 10) at the other end of the body 100. A threaded bore 106 extends longitudinally through male spherical post 76.

Shallow cylindrical pockets (of which one pocket 108 is shown in FIG. 9) are formed in plate 24 to respectively receive female spherical washers 74. Fasteners 72 (e.g., screws, bolts or the like) are provided (four for each subplate 70), to secure the subplates 70 to the flanges 86, 88 of the adjustment housing 68 with the apertures 96 of the subplates 70 corresponding in position with the apertures 90, 92 of the adjustment housing 68. Male cylindrical posts 76 are threadedly received in the apertures 96 of the subplates 70, and pass through the apertures 90, 92 of the adjustment housing 68. The convex spherical surface 104 of each male spherical post 76 is received in a respective one of the female spherical washers 74, each of which, in turn, is nested in a respective pocket (of which pocket 108 is shown in FIG. 9) in plate 24.

Adjustment housing 68 is secured to the frame 12 (at a position shown in FIG. 4, for example) by fasteners (not shown) inserted through the apertures 94. Because the apertures 94 are elongated in the Y axis direction, the position of adjustment housing 68 on the frame 12 may be adjusted in the Y axis direction. Other directions of adjustment may be similarly provided. Because the apertures 98 of the subplates 70 are elongated in the vertical (Z axis) direction, the position of each subplate 70 relative to the adjustment housing 68 can be adjusted in a vertical direction to accommodate accumulation of tolerances in the frame 12.

Adjustments to the pitch of the plate 24 may be made by driving both of the male spherical posts 76 by the same amount in the same direction. Yaw adjustments to the orientation of the plate 24 may be made by driving only one of the male spherical posts 76 or by driving the male spherical posts 76 by different amounts or in different directions. The shelf module 14 secured to the frame 12 by the lower attachment mechanism 30 is best seen in FIG. 11A.

During an exemplary installation of the shelf module 14 on the frame 12 the following steps are performed.

Figure 12:
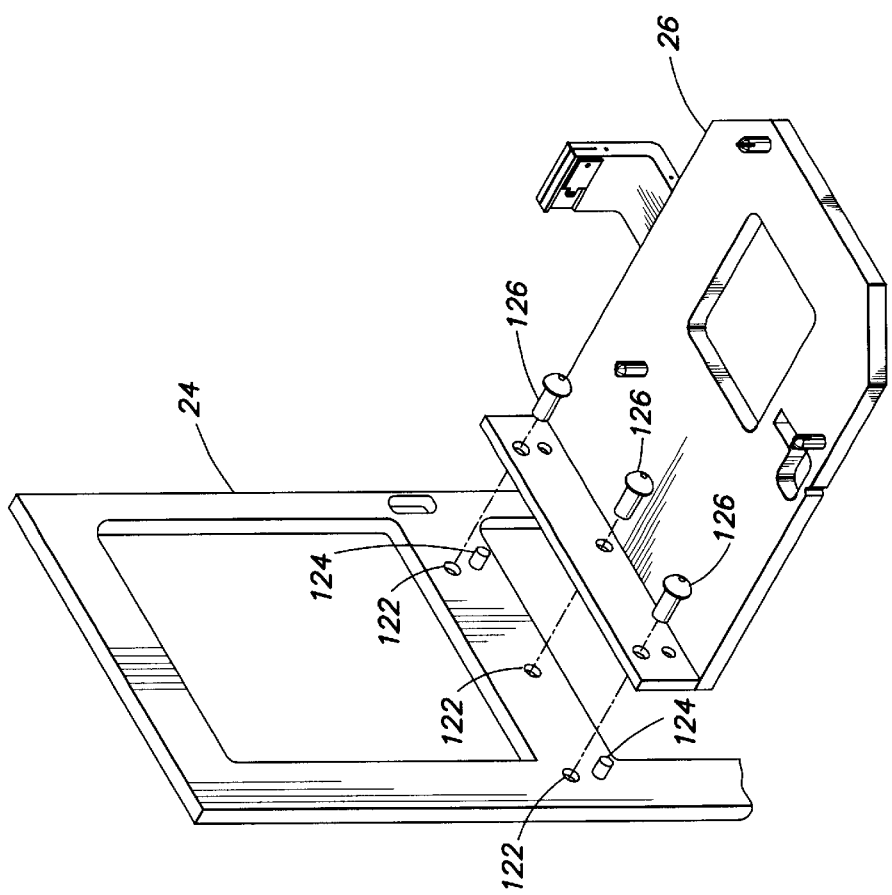
FIG. 12 is an exploded view that illustrates how a shelf is attached to the main plate of the shelf module.

First the shelves 26 are secured to the plate 24. FIG. 12 is an exploded view that illustrates one exemplary embodiment of the attachment of a shelf 26 to the plate 24. As stated, other techniques may be employed to attach the shelf 26 to the plate 24.

With reference to the embodiment of FIG. 12, features provided on the plate 24, such as holes 122 and pins 124, very accurately determine the positioning of the shelves 26 relative to the plate 24 and relative to each other. Accordingly, the shelf module 14 can be aligned as a unit relative to the docking station D (FIG. 1F) or some other reference. Fasteners 126 (e.g., screws, bolts, or the like) are used to attach the shelf 26 to the plate 24.

Male spherical post 34 of the upper attachment mechanism 28 is installed (e.g., threaded into a threaded aperture) at location 46 (FIGS. 6 and 6A) on plate 24, either before or after the shelves 26 are secured to the plate 24. Attachment block 32 is secured to the frame 12 at the position illustrated in FIG. 3 via fasteners (not shown) that extend through the elongated apertures 64. The shelf module 14 is then suspended from the attachment block 32 by seating the male spherical post 34 in the spherical depression 60 formed in flange 54 of attachment block 32. The shelf module 14 is thus suspendedly supported by attachment block 32 while further adjustments are performed. Only one person is required to initially suspend the shelf module 14 from the attachment block 32, and final adjustment of the position of the shelf module 14 can also be carried out by one person unaided since the shelf module 14 is supported on the attachment block 32. Thus, installation and alignment of the shelf module 14 is a one-person job notwithstanding the substantial size and weight of shelf module 14.

Turning now to the lower attachment mechanism 30 (FIG. 9), female spherical washers 74 are placed in the pockets (e.g., pocket 108, FIG. 9) of the plate 24. Further, the adjustment housing 68 is secured (e.g., bolted) to the frame 12 at the location shown in FIG. 4 via fasteners (not shown) that extend through the elongated apertures 94. Subplates 70 are secured to the flanges 86, 88 of the adjustment housing 68 by means of fasteners 72. Male spherical posts 76 are threadedly inserted into the apertures 96 of the subplates 70 until the convex spherical surfaces 104 of the male spherical posts 76 contact the female spherical washers 74 in the pockets of the plate 24. Accordingly it will be understood that the male spherical posts 76 are installed in a substantially horizontal position substantially in parallel with each other so that pitch adjustments may be made using both posts 76 and yaw adjustments may be made using either post 76.

Adjustments may now be performed by rotating one or both of the male spherical posts 76 to align the shelf module 14 with a suitable reference (e.g., the docking station D of FIG. 1F, a loadport of a factory interface (not shown), etc.). Thus the male spherical posts 76 function as adjustment members. For example, the shelf module 14 may be aligned to the docking station D that is mounted to a factory interface (not shown). Once adjustment of the male spherical posts 76 is complete, to obtain satisfactory alignment of the shelf module 14, cap screws 42 (upper attachment mechanism 28, FIG. 7) and 78 (lower attachment mechanism 30, FIG. 9) are installed to lock the shelf module 14 into position. Installation of the shelf module 14 is now complete.

Because the shelves 26 are pre-assembled into a precisely constructed module 14, the task of aligning the shelves to a reference (e.g., docking station D) is reduced to aligning the module as a unit to the reference. The upper attachment mechanism 28 provides a single point of support with a gimbaling function, so that one person can place the module 14 on the frame 12 and then have the module 14 held on the frame 12 during adjustment. Pitch and yaw adjustments are carried out by adjusting the two male spherical posts 76 of the lower attachment mechanism 30. Spherical joints are provided at the upper attachment mechanism 28 and the lower attachment mechanism 30 so that, as the plate 24 is moved into alignment, there is no bending or twisting of the plate 24 which would compromise the alignment of the individual shelves 26 in the shelf module 14. The shelf module 14 provided in accordance with the invention simplifies the shelf alignment process and saves labor.

The foregoing description discloses only an exemplary embodiment of the invention; modifications of the above-disclosed apparatus which fall within the scope of the invention will be readily apparent to those of ordinary skill in the art. For example, although the shelf module illustrated herein is shown as including three shelves, the number of shelves in the module may vary. For example, four or two shelves may be included in the shelf module.

Also, elements of the attachment mechanisms that have been shown as separate items could be integrally formed with the plate 24 or the frame 12. For example, the male spherical post 34 could be integrally formed with the plate 24 and/or the attachment block 32 could be integrally formed with the frame 12. The shapes of the various parts may change from those shown, and the specific couplings shown and the indicated orders of methods described herein may vary.

Furthermore, although the inventive shelf module has been shown as part of a substrate carrier storage facility located at a substrate processing station, it is also contemplated to use the shelf module of the present invention in connection with a centralized substrate carrier stocking facility.

Accordingly, while the present invention has been disclosed in connection with a preferred embodiment thereof, it should be understood that other embodiments may fall within the spirit and scope of the invention, as defined by the following claims.

The invention claimed is:

1. A shelf module adapted to store a plurality of substrate carriers, comprising:
   a plate;
   a plurality of shelves attached to the plate at respective elevations, each of the shelves being adapted to store a respective substrate carrier;
   an upper attachment mechanism located at an upper portion of the plate and adapted to attach the upper portion of the plate to a frame of a storage location; and
   a lower attachment mechanism located at a lower portion of the plate and adapted to attach the lower portion of the plate to the frame of the storage location;
   wherein one of the upper attachment mechanism and the lower attachment mechanism includes a portion of a gimbal joint, the portion of the gimbal joint being mounted on the plate and being adapted to mate with a corresponding gimbal joint portion provided on the frame of the storage location.

2. The shelf module of claim 1, wherein the other of the upper and lower attachment mechanisms is configured to provide pitch and yaw adjustments to the plate relative to the frame.

3. The shelf module of claim 1, wherein the lower attachment mechanism includes a pair of male spherical posts adapted to adjust the position of the plate relative to the frame of the storage location along respective axes corresponding to the pair of male spherical posts.

4. The shelf module of claim 3, wherein the lower attachment mechanism includes an adjustment housing adapted to be secured to the frame of the storage location and having a pair of apertures for respectively receiving the male spherical posts of the lower attachment mechanism.

5. A shelf module adapted to store a plurality of substrate carriers, comprising:
   a plate;
   a plurality of shelves attached to the plate at respective elevations, each of the shelves being adapted to store a respective substrate carrier;
   an upper attachment mechanism located at an upper portion of the plate and adapted to attach the upper portion of the plate to a frame of a storage location; and
   a lower attachment mechanism located at a lower portion of the plate and adapted to attach the lower portion of the plate to the frame of the storage location;
   wherein at least one of the upper attachment mechanism and the lower attachment mechanism is adjustable so as to allow the plurality of shelves attached to the plate to be aligned to a reference as a unit; and
   wherein one of the upper and lower attachment mechanisms includes a portion of a gimbal joint, the portion of the gimbal joint being mounted on the plate and being adapted to mate with a corresponding gimbal joint portion provided on the frame of the storage location, and the other of the upper and lower attachment mechanisms is configured to provide pitch and yaw adjustments to the plate relative to the frame.

6. A substrate carrier storage location comprising:
   a frame; and
   a shelf module adapted to store a plurality of substrate carriers, comprising:
      a plate secured to the frame; and
      a plurality of shelves attached to the plate at respective elevations, each of the shelves being adapted to store a respective substrate carrier;
   an upper attachment mechanism located at an upper portion of the plate and adapted to attach the upper portion of the plate to the frame; and
   a lower attachment mechanism located at a lower portion of the plate and adapted to attach the lower portion of the plate to the frame;
   wherein at least one of the upper attachment mechanism and the lower attachment mechanism is adjustable so as to allow the plurality of shelves attached to the plate to be aligned as a unit; and
   wherein one of the upper and lower attachment mechanisms includes a gimbal joint composed of a male gimbal joint portion attached to one of the plate and the frame and a female gimbal joint portion mating with the male gimbal joint portion and attached to the other of the plate and the frame, and the other of the upper and lower attachment mechanisms is configured to provide pitch and yaw adjustments to the plate relative to the frame.

7. A shelf module adapted to store a plurality of substrate carriers, comprising:
   a plate;
   a plurality of shelves attached to the plate at respective elevations, each of the shelves being adapted to store a respective substrate carrier;
   an upper attachment mechanism located at an upper portion of the plate and adapted to attach the upper portion of the plate to a frame of a storage location; and
   a lower attachment mechanism located at a lower portion of the plate and adapted to attach the lower portion of the plate to the frame of the storage location;
   wherein:
      at least one of the upper attachment mechanism and the lower attachment mechanism is adjustable so as to allow the plurality of shelves attached to the plate to be aligned to a reference as a unit; and
      the upper attachment mechanism includes a male spherical post which extends downwardly from the upper portion of the plate and has a convex spherical surface adapted to rest on a female spherical seat attached to the frame of the storage location.

8. The shelf module of claim 7, wherein the upper attachment mechanism further includes a mechanism adapted to secure the male spherical post to a block in which the spherical seat is formed.

9. The shelf module of claim 7, wherein the lower attachment mechanism includes a pair of male spherical posts adapted to adjust the position of the plate relative to the frame of the storage location along respective axes corresponding to the pair of male spherical posts.

10. The shelf module of claim 9, wherein the lower attachment mechanism further includes an adjustment housing adapted to be secured to the frame of the storage location and having a pair of apertures for respectively receiving the male spherical posts of the lower attachment mechanism.

11. The shelf module of claim 10, wherein the lower attachment mechanism further includes a pair of subplates adapted to be secured to the adjustment housing and a plurality of fasteners adapted to secure a respective one of the subplates to the adjustment housing adjacent each of the apertures of the adjustment housing.

12. The shelf module of claim 11, wherein each of the subplates has an aperture adapted to receive a respective one of the male spherical posts of the lower attachment mechanism.

13. The shelf module of claim 12, wherein the lower attachment mechanism further includes a pair of female spherical washers, each adapted to rest in a respective pocket formed in the plate and to be in contact with a convex spherical surface of a respective one of the male spherical posts of the lower attachment mechanism.

14. The shelf module of claim 13, wherein the male spherical posts are adapted to be secured to the plate and wherein the lower attachment mechanism further includes a pair of mechanisms each adapted to secure a respective one of the male spherical posts of the lower attachment mechanism to the plate.

15. A shelf module adapted to store a plurality of substrate carriers, comprising:
   a plate;
   a plurality of shelves attached to the plate at respective elevations, each of the shelves being adapted to store a respective substrate carrier;
   an upper attachment mechanism located at an upper portion of the plate and adapted to attach the upper portion of the plate to a frame of a storage location; and
   a lower attachment mechanism located at a lower portion of the plate and adapted to attach the lower portion of the plate to the frame of the storage location;
   wherein:
      at least one of the upper attachment mechanism and the lower attachment mechanism is adjustable so as to allow the plurality of shelves attached to the plate to be aligned to a reference as a unit; and
      the lower attachment mechanism includes:
         a pair of male spherical posts adapted to adjust the position of the plate relative to the frame of the storage location along respective axes corresponding to the pair of male spherical posts;
         an adjustment housing adapted to be secured to the frame of the storage location and having a pair of apertures for respectively receiving the male spherical posts of the lower attachment mechanism; and
         a pair of subplates and a plurality of fasteners adapted to secure a respective one of the subplates to the adjustment housing adjacent each of the apertures of the adjustment housing.

16. The shelf module of claim 15, wherein each of the subplates has an aperture adapted to receive a respective one of the male spherical posts of the lower attachment mechanism.

17. The shelf module of claim 16, wherein the lower attachment mechanism further includes a pair of female spherical washers, each adapted to rest in a respective pocket formed in the plate and in contact with a convex spherical surface of a respective one of the male spherical posts of the lower attachment mechanism.

18. The shelf module of claim 17, wherein the male spherical posts are adapted to be secured to the plate and wherein the lower attachment mechanism further includes a pair of mechanisms each adapted to secure a respective one of the male spherical posts of the lower attachment mechanism to the plate.

19. A storage location adapted to store a plurality of substrate carriers, comprising:
   a frame;
   a plate secured to the frame;
   a plurality of shelves attached to the plate at respective elevations, each of the shelves being adapted to store a respective substrate carrier;
   an upper attachment mechanism located at an upper portion of the plate and adapted to attach the upper portion of the plate to the frame; and
   a lower attachment mechanism located at a lower portion of the plate and adapted to attach the lower portion of the plate to the frame;
   wherein one of the upper attachment mechanism and the lower attachment mechanism includes a gimbal joint composed of a male gimbal joint portion attached to one of the plate and the frame and a female gimbal joint portion mating with the male gimbal joint portion and attached to the other of the plate and the frame.

20. The storage location of claim 19, wherein the other of the upper and lower attachment mechanisms is configured to provide pitch and yaw adjustments to the plate relative to the frame.

21. The storage location of claim 19, wherein the other of the upper and lower attachment mechanisms allows the plurality of shelves attached to the plate to be aligned to a reference as a unit.

22. A storage location adapted to store a plurality of substrate carriers, comprising:
   a frame;
   a plate secured to the frame;
   a plurality of shelves attached to the plate at respective elevations, each of the shelves being adapted to store a respective substrate carrier;
   an upper attachment mechanism located at an upper portion of the plate and adapted to attach the upper portion of the plate to the frame; and
   a lower attachment mechanism located at a lower portion of the plate and adapted to attach the lower portion of the plate to the frame;
   wherein:
      at least one of the upper attachment mechanism and lower attachment mechanism is adjustable so as to allow the plurality of shelves attached to the plate to be aligned to a reference as a unit; and
      the upper attachment mechanism includes a male spherical post in a vertical orientation and the lower attachment mechanism includes a pair of male spherical posts arranged substantially in parallel in a horizontal orientation.

23. The storage location of claim 22, wherein the lower attachment mechanism further includes an adjustment housing which couples the pair of male spherical posts of the lower attachment mechanism to the frame.

24. A method of assembling a storage location adapted to store a plurality of substrate carriers, comprising the method steps of:
   providing a shelf module comprising a plate adapted to support a plurality of shelves, each shelf adapted to store a respective substrate carrier;
   suspending the plate from a frame of the storage location via an upper attachment mechanism located at an upper portion of the plate;
   attaching the suspended plate to the frame at a lower portion of the plate via a lower attachment mechanism located at the lower portion of the plate; and adjusting a position of the plate relative to the frame by rotating at least one spherical post that is included in one of the upper attachment mechanism and the lower attachment mechanism.

25. The method of claim 24, wherein the adjusting step comprises adjusting a pitch and yaw of the plate relative to the frame.

26. The method of claim 24, wherein the adjusting step includes adjusting a pair of adjustment members at the lower portion of the plate.

27. The method of claim 24, further comprising attaching a plurality of shelves to the plate.

28. The method of claim 27, wherein the plurality of shelves are attached to the plate before, while or after the plate is aligned to the reference.

29. The method of claim 24, wherein the adjusting step is performed so as to align the plate to a reference so that the shelves supported on the plate are aligned to the reference as a unit.

30. The method of claim 29, wherein the reference is a docking station adjacent to the frame.

31. The method of claim 24, further comprising:
locking the shelf module into position.

32. A shelf module adapted to store a plurality of substrate carriers, comprising:
a plate;
a plurality of shelves attached to the plate at respective elevations, each of the shelves being adapted to store a respective substrate carrier; and
a gimbal joint portion secured to the plate and adapted to mate with a complementary gimbal joint portion provided on a frame of a storage location.

33. The shelf module of claim 32, wherein the gimbal joint portion secured to the plate has a downwardly oriented male spherical surface.

34. The shelf module of claim 32, wherein the gimbal joint portion secured to the plate has a downwardly oriented female spherical surface.

35. The shelf module of claim 32, wherein the gimbal joint portion secured to the plate is secured to an upper portion of the plate.

36. The shelf module of claim 32, wherein the gimbal joint portion secured to the plate is secured to a lower portion of the plate.

37. The shelf module of claim 32, further comprising an attachment mechanism coupled to the plate and configured to provide pitch and yaw adjustments to the plate relative to a frame.

38. A method of assembling a storage location adapted to store a plurality of substrate carriers, comprising the method steps of:
providing a plate adapted to support a plurality of shelves, each shelf adapted to store a respective substrate carrier;
supporting the plate on a frame that also supports a robot; and
connecting the plate to the frame via a first attachment mechanism located at an upper portion of the plate and via a second attachment mechanism located at a lower portion of the frame so as to allow adjustment of a position of the plate relative to the frame and thereby align the plurality of shelves, when attached to the plate, to the robot as a unit.

39. The method of claim 38, further comprising:
attaching a plurality of shelves to the plate.

40. The method of claim 39, wherein the attaching step is performed before the plate is supported on the frame.

41. The method of claim 39, wherein the attaching step is performed at a time when the plate is supported on the frame.

42. The method of claim 38, further comprising:
bringing a gimbal joint portion provided on the plate into contact with a gimbal joint portion provided on the frame to form a gimbal joint between the plate and the frame.

43. A storage location adapted to store a plurality of substrate carriers, comprising:
a frame;
a robot supported on the frame and adapted to transport a substrate carrier;
a plate supported on the frame and adjustably connected to the frame via a first attachment mechanism located at an upper portion of the plate and via a second attachment mechanism located at a lower portion of the frame; and
a plurality of shelves attached to the plate at respective elevations, each of the shelves being adapted to store a respective substrate carrier;
wherein the plate is adjustably connected to the frame so as to allow the plurality of shelves attached to the plate to be aligned to the robot as a unit.

44. The storage location of claim 43, wherein the shelves extend away from the plate in a direction parallel to a horizontal direction of movement of the robot.

45. A storage location adapted to store a plurality of substrate carriers, comprising:
a frame;
a robot supported on the frame and adapted to transport a substrate carrier;
a plate supported on the frame and adjustably connected to the frame via a first attachment mechanism located at an upper portion of the plate and via a second attachment mechanism located at a lower portion of the frame; and
at least one shelf attached to the plate and adapted to store a substrate carrier;
wherein the plate is adjustably connected to the frame so as to allow each shelf of the at least one shelf to be aligned to the robot as a unit.

* * * * *